(12) United States Patent
Lau

(10) Patent No.: US 8,037,238 B2
(45) Date of Patent: *Oct. 11, 2011

(54) MULTIPLE MODE CONTENT-ADDRESSABLE MEMORY

(75) Inventor: Michael H. Lau, Elk Grove, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/605,828

(22) Filed: Oct. 26, 2009

(65) Prior Publication Data

US 2010/0042780 A1 Feb. 18, 2010

Related U.S. Application Data

(63) Continuation of application No. 11/592,258, filed on Nov. 3, 2006, now Pat. No. 7,610,441.

(60) Provisional application No. 60/735,214, filed on Nov. 10, 2005.

(51) Int. Cl.
*G06F 12/00* (2006.01)
(52) U.S. Cl. ........................................... 711/108
(58) Field of Classification Search .......... None
See application file for complete search history.

(56) References Cited

U.S. PATENT DOCUMENTS

| | | | |
|---|---|---|---|
| 6,332,159 B1 | 12/2001 | Hatea et al. | |
| 6,473,797 B1 | 10/2002 | Hirasawa et al. | |
| 6,512,684 B2 | 1/2003 | Gordon et al. | |
| 6,553,453 B1* | 4/2003 | Gibson et al. | 711/108 |
| 6,721,818 B1 | 4/2004 | Nakamura | |
| 6,763,426 B1* | 7/2004 | James et al. | 711/108 |
| 6,775,166 B2 | 8/2004 | McKenzie et al. | |
| 6,876,558 B1 | 4/2005 | James et al. | |
| 7,062,601 B2 | 6/2006 | Becca | |
| 7,610,441 B2 | 10/2009 | Lau | |
| 2002/0188364 A1 | 12/2002 | Ota et al. | |
| 2003/0025735 A1 | 2/2003 | Polgar et al. | |
| 2003/0046657 A1 | 3/2003 | White | |
| 2004/0230740 A1* | 11/2004 | Chow et al. | 711/108 |

* cited by examiner

*Primary Examiner* — Hiep Nguyen

(57) ABSTRACT

According to embodiments of the invention a multi-mode memory device is provided. The memory device includes at least one content-addressable memory (CAM). The memory device further includes a first match-in bus for receiving input into a first CAM of the at least one CAM, wherein the status of the match-in bus determines a operating mode of a plurality of operating modes of the first CAM, and a match-out bus for enabling the first CAM to be coupled to another CAM module and comprises match lines of a memory portion of the first CAM, wherein if the match-in bus is disabled, first CAM is in a first mode, and if the match-in bus is enabled, the first CAM is in a second mode.

12 Claims, 5 Drawing Sheets

MULTIPLE MODE CONTENT-ADDRESSABLE MEMORY

CROSS REFERENCE TO RELATED APPLICATIONS

This application is a continuation of U.S. patent application Ser. No. 11/592,285, filed Nov. 3, 2006, entitled "MULTIPLE MODE CONTENT-ADDRESSABLE MEMORY," now U.S. Pat. No. 7,610,441, which claims the benefit of U.S. Provisional Patent Application No. 60/735,214, filed on Nov. 10, 2005, both of which are hereby incorporated by reference in entirety.

BACKGROUND OF THE INVENTION

1. Field of the Invention

The invention relates to a method and apparatus for high performance switching in local area communications networks. In particular, the invention relates to content addressable memory cells (CAM) for accommodating increased data width in content addressable memory modules.

2. Description of the Related Art

A switching system may include one or more network devices, such as an Ethernet switching chip, each of which includes several modules that are used to process information that is transmitted through the device. Specifically, the device may include at least one egress module, a Memory Management Unit (MMU) and at least one egress module. The ingress module may include switching functionality for determining to which destination port a packet should be directed. The MMU is used for storing packet information and performing resource checks. The egress module may be used for performing packet modification for transmitting the packet to at least one appropriate destination port. One of the ports on the device may be a CPU port that enables the device to send and receive information to and from external switching/routing control entities or CPUs. Some devices also include a CPU processing module through which the device interfaces with external CPU ports.

In the processing of datagrams, such as packets, certain packets may receive preferential treatment when compared to other packets. As such, certain packets may be assigned a higher Quality of Service (QoS), such that those packets are given preferred treatment. This preferred treatment may be given, for example, to packets where time sensitive receipt of those packets is important. In many prior art systems, many QoS states are assigned, so that varying degrees of handling and prioritization can be provided. However, even if a small amount of bandwidth is allocated to a particular QoS state and is not used, that bandwidth is "wasted," in that it could be utilized by other resources. Thus, there is a need in the prior art for systems that allow for dynamic management of buffers and thresholds to allow for efficient utilization of all resources of a network device.

BRIEF DESCRIPTION OF THE DRAWINGS

For the present invention to be easily understood and readily practiced, various embodiments will now be described, for purposes of illustration and not limitation, in conjunction with the following figures.

DETAILED DESCRIPTION

The present invention is directed to many embodiments that provide many useful features with respect to data storage and retrieval.

Figure 1:
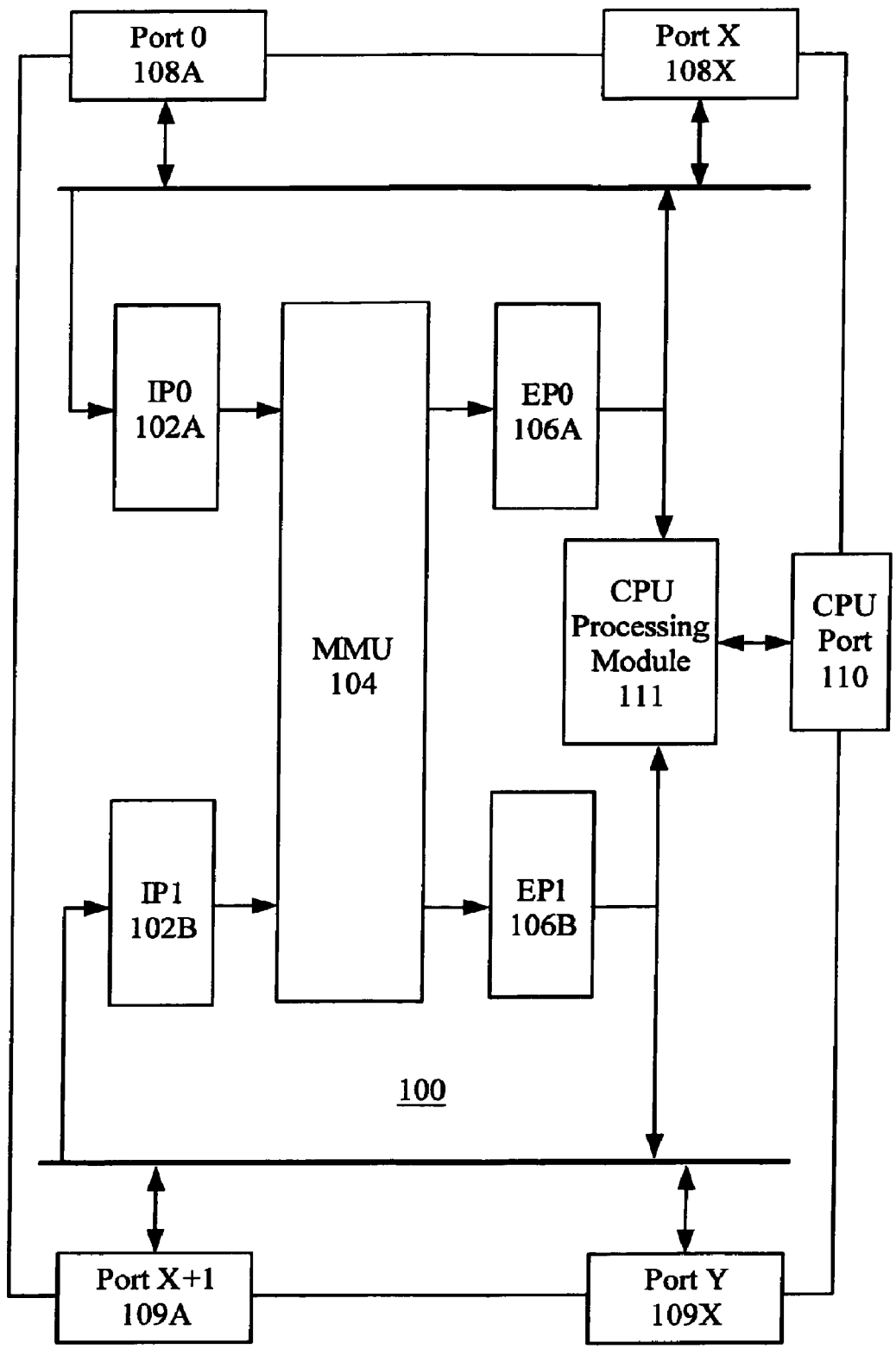
FIG. 1 is an illustration of a network device in which an embodiment of the present invention may be implemented.

FIG. 1 illustrates a network device, such as a switching chip, in which an embodiment the present invention may be implemented. Device 100 includes ingress modules 102A and 102B, a MMU 104, and egress modules 106A and 106B. Ingress modules 102A and 102B are used for performing switching functionality on an incoming packet. MMU 104 is used for storing packets and performing resource checks on each packet. Egress modules 106A and 106B are used for performing packet modification and transmitting the packet to an appropriate destination port. Each of Ingress modules 102A, 102B, MMU 104 and Egress modules 106A and 106B include multiple cycles for processing instructions generated by that module. Device 100 implements a dual-pipelined approach to process incoming packets. One aspect which affects the performance of device 100 is the ability of the pipelines to process one packet every clock cycle. It is noted that the embodiment illustrated in FIG. 1 shows dual-pipelines, the present invention may also be applicable to systems that use a single pipeline or more than two pipelines.

Device 100 can also include a number of ports to send and receive data, such as Port 0 to Port X, 108A-108X, and Port X+1 to Port Y, 109A-109X. The ports can be separated and are serviced by different ingress and egress port modules to support the dual-pipeline structure. One or more internal fabric high speed ports, for example a highspeed port, or more external Ethernet ports may be configured from the above-discussed ports. The network device can also include a CPU port 110 and a CPU processing module 11 to communicate with an external CPU. High speed ports are used to interconnect various network devices in a system and thus form an internal switching fabric for transporting packets between external source ports and one or more external destination ports. As such, high speed ports are not externally visible outside of a system that includes multiple interconnected network devices. CPU port 110 can be used to send and receive packets to and from external switching/routing control entities or CPUs. Device 100 interfaces with external/off-chip CPUs through a CPU processing module 111, which interfaces with a PCI bus that connects device 100 to an external CPU.

Network traffic also enters and exits device 100 through external ports 108A-108X and 109A-109X. Specifically, traffic in device 100 is routed from an external source port to one or more unique destination ports. In one embodiment of the invention, device 100 supports physical Ethernet ports and logical (trunk) ports. A physical Ethernet port is a physical port on device 100 that is globally identified by a global port identifier. In an embodiment, the global port identifier includes a module identifier and a local port number that uniquely identifies device 100 and a specific physical port. The trunk ports are a set of physical external Ethernet ports that act as a single link layer port. Each trunk port is assigned a global trunk group identifier (TGID). According to an embodiment, device 100 can support up to 128 trunk ports, with up to 8 members per trunk port, and up to 29 external physical ports.

Once a packet enters device 100 on a source port 109A-109X or 108A-108X, the packet is transmitted to one of the ingress modules 102A or 102B for processing. Packets may enter device 100 from a XBOD or a GBOD. The XBOD is a block that has one 10 GE/12 G MAC and supports packets from high speed ports and the GBOD is a block that has 12 10/100/1 G MAC and supports packets from other ports.

The architecture of the network device provides for the ability to process data received quickly and also allows for a flexibility of processing. A part of this flexibility comes from the pipeline structure that is used to process packets once they are received. Data from the packet and attributes of that packet move through the modules of the network device, discussed above, in a pipeline structure. Each stage in the pipeline structure requires a set number of clock cycles and the packets are processed in order. Therefore, the packet is parsed, table lookups are performed, a decision routing process is performed and the packet is modified, before being sent out on an egress port. Each stage in the pipeline performs its function so that the overall function of the network device is achieved.

Figure 2:
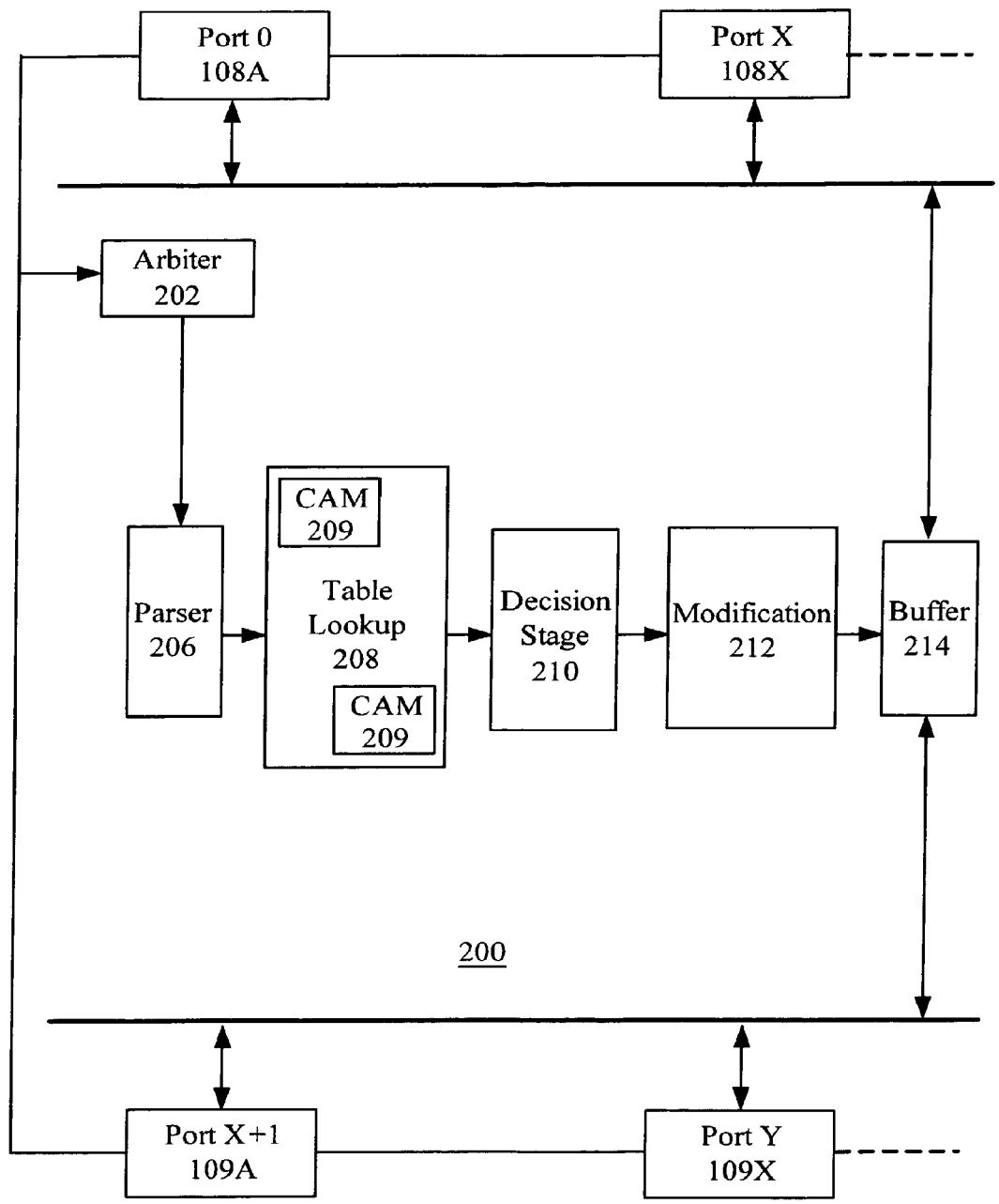
FIG. 2 illustrates a centralized pipeline architecture with ingress and egress stages in an exemplary embodiment of the present invention.

FIG. 2 illustrates a centralized pipeline architecture with ingress and egress stages in an exemplary embodiment of the present invention. The ingress pipeline can include an arbiter 202, a parser 206, a table lookup stage 208, multiple content-addressable memories (CAMs) 209, a decision stage 210. The egress pipeline may include a modification stage 212 and a data buffer 214. Arbiter 202 provides arbitration for accessing egress pipeline 200 resources between packet data and control information from MMU and information from the CPU. Parser 206 performs packet parsing for table lookups and modifications. Table lookup stage 208 performs table lookups for information transmitted from parser 206, through use of the CAMs 209. The decision stage 210 is used for deciding whether to modify, drop or otherwise process the packet. The modification stage 212 makes modifications to the packet data based on outputs from previous stages of the ingress module.

Arbiter 202 collects packet data and control information from MMU 104 and read/write requests to registers and memories from the CPU and synchronizes the packet data and control information from MMU 104 and writes the requests from the CPU in a holding register. Based on the request type from the CPU, arbiter 202 generates pipeline register and memory access instructions and hardware table initialization instructions. After arbiter 202 collects packet data, CPU requests and hardware table initialization messages, it generates an appropriate instruction. According to an embodiment, arbiter 202 generates a Start Cell Packet instruction, an End Cell of Packet instruction, a Middle Cell of Packet instruction, a Start-End Cell of Packet instruction, a Register Read Operation instruction, a Register Write Operation instruction, a Memory Read Operation instruction, a Memory Write Operation instruction, a Memory Reset Write Operation instruction, a Memory Reset Write All Operation instruction and a No Operation instruction. Egress pipeline resources associated Start Cell Packet instructions and Start-End Cell of Packet instructions are given the highest priority by arbiter 204. End Cell of Packet instructions, Middle Cell of Packet instructions, Register Read Operation instructions, Register Write Operation instructions, Memory Read Operation instructions and Memory Write Operation instruction receive the second highest priority from arbiter 204. Memory Reset Write Operation instructions and Memory Reset Write All Operation instructions receive the third highest priority from arbiter 204. No Operation instructions receive the lowest priority from arbiter 204.

After receiving an instruction from arbiter 204, the parser 206 parses packet data associated with the Start Cell of Packet instruction and the Start-End Cell of Packet instruction using the control information and a configuration register transmitted from arbiter 206. According to an embodiment, the packet data is parsed to obtain L2, L3 and L4 fields which appear in the first 148 bytes of the packet. Table lookup stage 208 then receives all packet fields and register values from parser 206.

Figure 3:
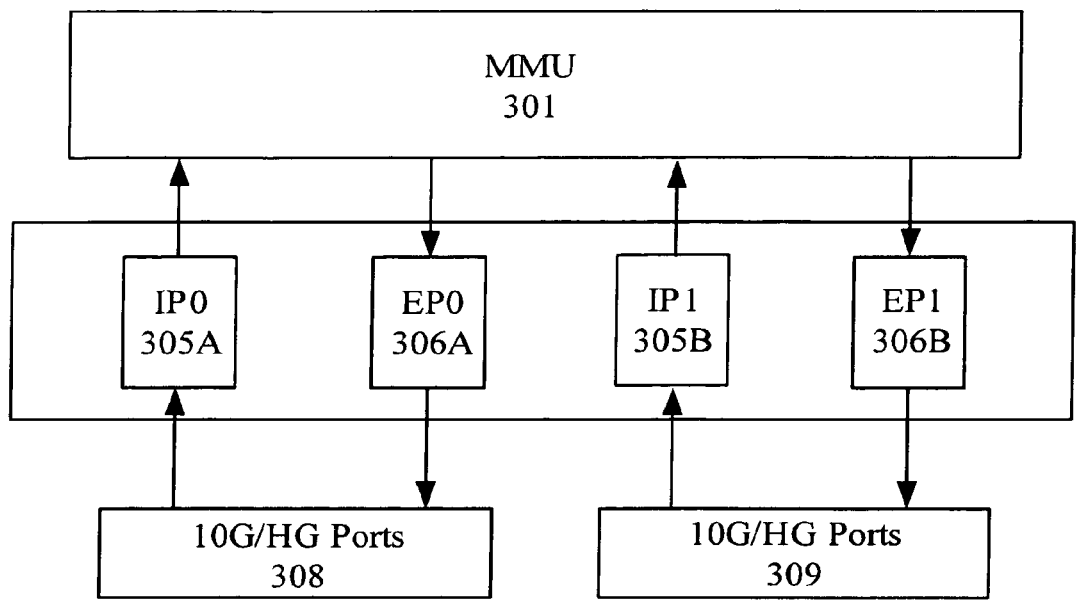
FIG. 3 illustrates multiple pipelines for controlling flows of data from the ports to and from the MMU in an exemplary embodiment of the present invention.

As discussed above, the network device can, according to certain embodiments, use two sets of IP/EP pipelines to support 20 ports of 10 GE (or 16 ports of 12 G highspeed) as shown in FIG. 3. Thus, in the illustrated embodiment, ports 0-9 308 are served by IP0 305A and EP0 306A, and ports 10-19 309 are served by IP1 305B and EP1 306B. Both sets of modules communicate with a single MMU 301.

Figure 4:
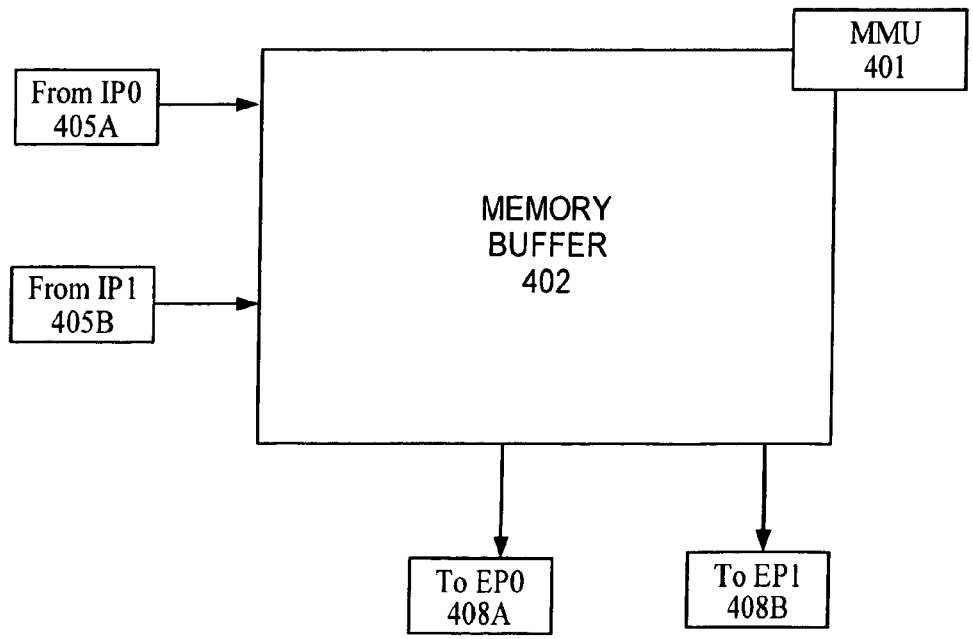
FIG. 4 illustrates an exemplary memory device.

To support 20 ports of 10 GE, the MMU 401 utilizes a centralized memory buffer device 402, as illustrated in FIG. 4. Thus, data coming from IP0 405A and/or IP1 405B is received by the memory buffer device 402 before being sent to EP0 408A and EP1 408B.

Each of the ingress module, the MMU, and the egress module includes one or more internal Random Access Memory (RAM) and Content Addressable Memory (CAM) for storing information. For example, the ingress and egress modules may store lookup tables with switching information in the internal CAM. When the device is initialized, information is stored in each CAM. During normal processing, the information in one or more CAM may be updated either by the device or by the CPU. To synchronize the information stored in the CAM with the information stored on the CPU, the CPU may need to access and/or update the information stored in one or more CAM.

As such, if the CPU had to insert and/or delete an entry in a CAM, a table DMA engine in the CPU processing module copied all entries from the table to the CPU. Upon modifying the table, the CPU transmitted one entry at a time to the CAM to be modified. For a CAM with a large amount of entries, this operation is not only slow, it is costly since numerous write operations are required in order to update one entry in the CAM.

One of the quickest methods of table searching uses CAM searching wherein all table entries are compared against a search key at the same time, and the search result is delivered to an output instantly. However, in CAM searching there is typically a limit to the size of comparison fields (i.e. data width) and the size of payload fields which may be used in CAM searching.

The CAM module is able to search its memory contents for a given key. The CAM module provides a single-bit indication of whether a match is found. If a match is found, the CAM module also outputs a match_index value which indicates which entry of the memory resulted in the match.

As discussed above, the width of the entry and the key are limited by the width of the CAM module. If a larger data width is required for some applications such as that illustrated in FIG. 2, the overall CAM module width must be larger as the widest possible case.

Thus, in order to accommodate wider entry, multiple CAMs are linked together to provide the required CAM module width, each CAM requires one cycle each in order to have the total contents searched. A first CAM module is searched during a first cycle. If no match is found, then a second CAM in the chain is searched during the second cycle and so on. Thus, a configuration that includes N CAM modules would require N cycles to search the N CAM modules.

However, as illustrated in FIG. 2, the device 100 may include two ingress pipelines and two egress pipelines. Therefore, in this configuration, two memory cell locations need to be accessed (read or write) per one clock cycle.

Figure 5:
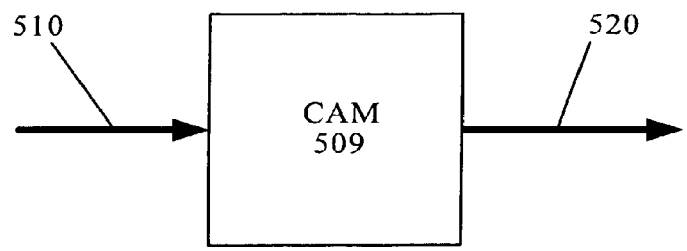
FIG. 5 illustrates an exemplary embodiment of the present invention.

FIG. 5 illustrates an exemplary embodiment of the invention. According to this embodiment a CAM module that includes at least two additional buses that enables a "wide" CAM mode wherein several CAM modules are linked together to form a single searchable "logical" CAM. The first additional bus is a "match-out" bus 520. The match-out bus 520 includes match lines from the memory portion of the CAM module.

The second bus is a "match-in" bus 510. The match-in bus 510 is an input bus that receives the match out signals from the previous CAM module in the chain if the CAM module is in "wide" mode. If the CAM is in "normal" mode, the match-in bus is disabled. In wide mode, the CAM combines the match-in bus with its local match lines to determine if the complete "wide" entry has matched.

Figure 6:
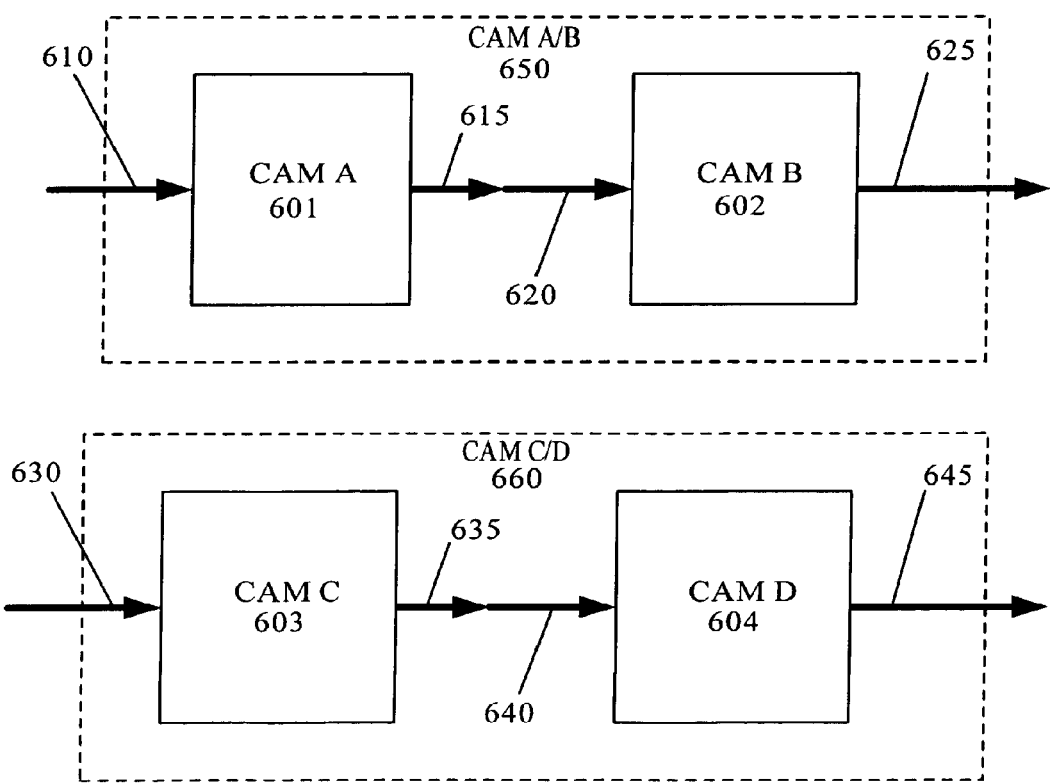
FIG. 6 illustrates another exemplary embodiment of the present invention.

Another exemplary embodiment of the invention is illustrated in FIG. 6. According to this embodiment, CAM modules A, B, C and D are configured in "double wide" mode, to operate as a pair of logical CAM modules CAM A/B and CAM C/D. In this example, CAM A and CAM B are connected together to form the first logical CAM A/B, and CAM C and CAM D are connected together to form the second logical CAM module CAM C/D. As shown in FIG. 6, CAM A includes a match-in bus 610 and a match-out bus 615. CAM B includes match-in bus 620 and match-out bus 625. The match-out bus 615 of CAM A 601 is connected to the enabled match-in bus 620 of CAM B 602. Thus, the combination of CAM A and CAM B form one logical CAM module CAM A/B 650. Similarly, CAM C 603 includes a match-in bus 630 and match-out bus 635, and CAM D 604 includes a match-in bus 640 and match-out bus 645. The match-out bus 635 of CAM C 603 is connected to the enabled match-in bus 640 of CAM D 604. Thereby forming the logical CAM C/D 660. CAM A/B and CAM C/D are each searchable in one cycle and can accommodate "double-wide" entry.

The last CAMs in the match chains, in this example CAM B and CAM D, determine the match result and will also generate the match index value discussed above to indicate if the complete "wide" entry has been matched, in one search cycle.

Figure 7:
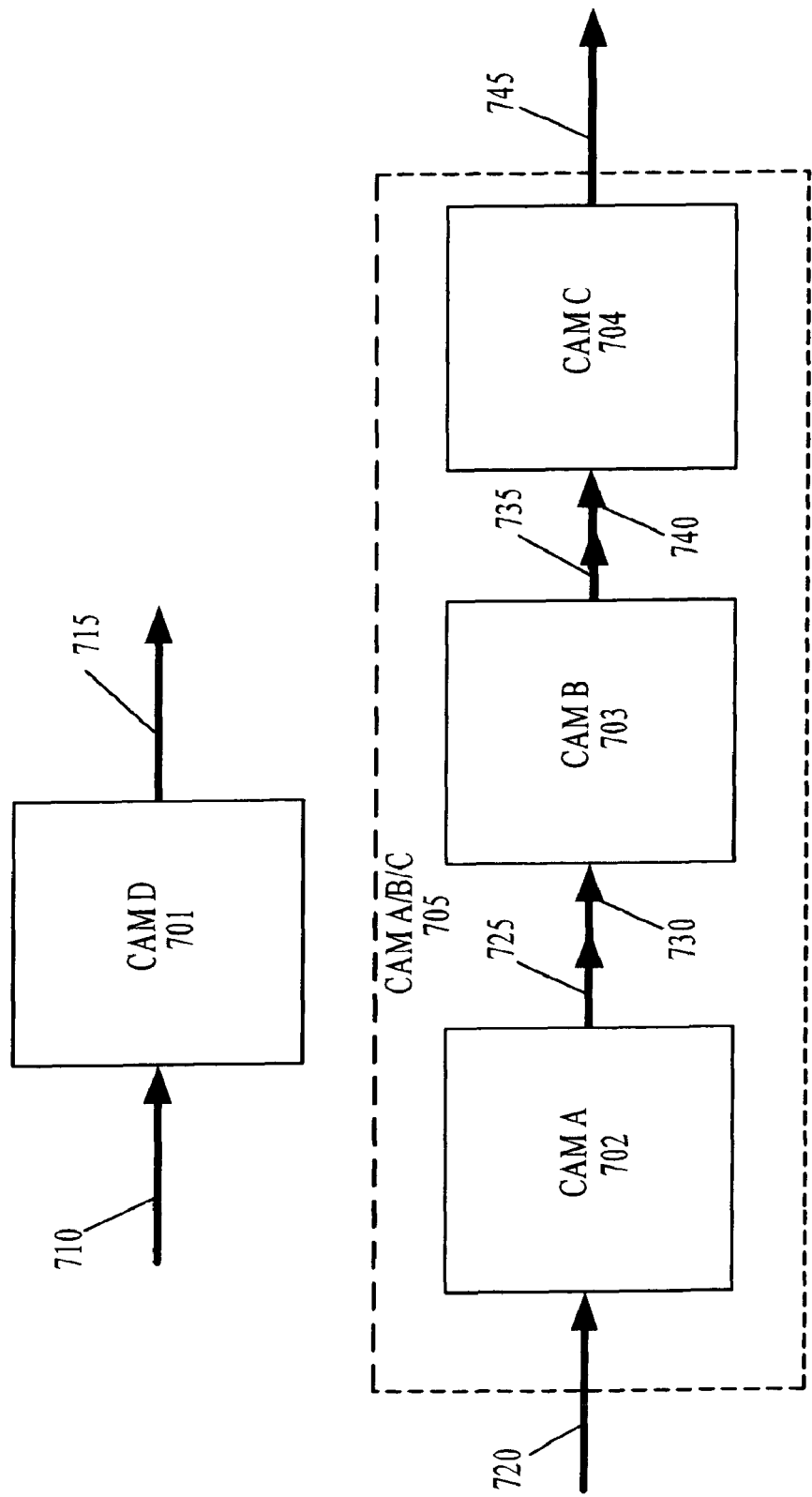
FIG. 7 illustrates yet another exemplary embodiment of the present invention.

FIG. 7 illustrates another exemplary embodiment of the invention. In this example, the CAM modules can also be configured in "triple wide" mode to accommodate even wider data entry than the configurations shown in FIG. 6. CAM modules A 702, B 703, and C 704 are configured in triple wide" mode and CAM D 701 is configured in normal mode wherein the match-in bus 710 is disabled. The match-out bus 725 of CAM A 702 is connected to the match-in bus 730 of CAM B 703. The match-out bus 735 of CAM B 703 is connected to the match-in bus 740 of CAM C 704. Thus, the contents of logical CAM module A/B/C 705 are searched in one cycle. Also in this configuration, the last CAM module CAM C, after a determination of the match result is made, will generate the match index value that indicates which entry of the logical CAM B/C/D has matched. In this configuration, CAM D 701 is searched independently from logical CAM A/B/C 705. However both CAM D 701 and logical CAM A/B/C are each searchable in one clock cycle.

One of average skill in the art will also recognize that the functional building blocks, and other illustrative blocks, modules and components herein, can be implemented as illustrated or by discrete components, application specific integrated circuits, processors executing appropriate software and the like or any combination thereof. For example, a network device may include but is not limited to a switch, router, bridge or any network device known in the art.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A network device comprising:
   a first content addressable memory (CAM);
   a second CAM that is operably coupled to the first CAM to form a logical CAM, wherein the logical CAM is configurable to be searched in one memory cycle;
   a third CAM; and
   a fourth CAM that is operably coupled to the third CAM to form another logical CAM, wherein the another logical CAM is configurable to be searched in one memory cycle and wherein the logical CAM and the another logical CAM are configured to operate as a pair of logical CAMs.

2. The network device of claim 1 wherein the logical CAM is configured to determine a match result and to generate a match index value for the logical CAM.

3. The network device of claim 1 further comprising a match-in bus that is operably coupled to the logical CAM, wherein the match-in bus is enabled or disabled based on a mode of the logical CAM.

4. The network device of claim 1 further comprising:
   a match-in bus that is operably coupled to an input of the logical CAM; and
   a match-out bus that is operably coupled to an output of the logical CAM.

5. The network device of claim 1 further comprising:
   a first match-in bus operably coupled to an input of the logical CAM;
   a second match-in bus operably coupled to an input of the another logical CAM;
   a first match-out bus operably coupled to an output of the logical CAM; and
   a second match-out bus operably coupled to an output of the another logical CAM.

6. The network device of claim 1 wherein the logical CAM comprises multiple operating modes.

7. The network device of claim 6 wherein the operating modes of the logical CAM are user selectable.

8. The network device of claim 1 wherein the another logical CAM is configured to determine a match result and to generate a match index value for the another logical CAM.

9. The network device of claim 1 further comprising a match-in bus that is operably coupled to the another logical CAM, wherein the match-in bus is enabled or disabled based on a mode of the another logical CAM.

10. The network device of claim 1 wherein the another logical CAM comprises multiple operating modes.

11. The network device of claim 10 wherein the operating modes of the another logical CAM are user selectable.

12. The network device of claim 1 wherein the pair of logical CAMs are configured to handle a double-wide entry.

* * * * *